US010715307B1

(12) United States Patent
Jin (10) Patent No.: US 10,715,307 B1
(45) Date of Patent: Jul. 14, 2020

(54) EMBEDDED TIME OF DAY RECEIVER FOR CLOCK TRANSMISSION

(71) Applicant: Microsemi Semiconductor ULC, Kanata (CA)

(72) Inventor: Qu Gary Jin, Ottawa (CA)

(73) Assignee: Microsemi Semiconductor ULC, Kanata (CA)

( * ) Notice: Subject to any disclaimer, the term of this patent is extended or adjusted under 35 U.S.C. 154(b) by 0 days.

(21) Appl. No.: 16/563,399

(22) Filed: Sep. 6, 2019

Related U.S. Application Data (60) Provisional application No. 62/881,895, filed on Aug. 1, 2019.

(51) Int. Cl.
 H04W 4/00 (2018.01)
 H04L 7/033 (2006.01)
 H04J 3/02 (2006.01)
 H03M 13/11 (2006.01)
 H04J 3/06 (2006.01)

(52) U.S. Cl.
 CPC ....... H04L 7/0331 (2013.01); H03M 13/1111 (2013.01); H04J 3/025 (2013.01); H04J 3/0685 (2013.01); H04W 4/00 (2013.01)

(58) Field of Classification Search
 USPC ................. 375/360, 219, 371, 376
 See application file for complete search history.

(56) References Cited

U.S. PATENT DOCUMENTS 5,838,512 A * 11/1998 Okazaki ................. G11B 5/012
 360/51
5,850,422 A * 12/1998 Chen ......................... H03L 7/07
 375/371
6,044,122 A * 3/2000 Ellersick ............... H04L 7/0338
 327/12
6,138,061 A * 10/2000 McEnnan .............. B64G 1/242
 701/13
6,823,001 B1 * 11/2004 Chea ........................ H04L 5/16
 375/219
7,239,650 B2 7/2007 Rakib et al.

OTHER PUBLICATIONS

PCT/CA2019/000165, International Search Report, Canadian Intellectual Property Office, dated Apr. 9, 2020.
PCT/CA2019/000165, Written Opinion, Canadian Intellectual Property Office, dated Apr. 9, 2020.

* cited by examiner

Primary Examiner — Eva Y Puente
(74) Attorney, Agent, or Firm — Glass and Associates; Kenneth Glass (57) ABSTRACT

In a receiver a method for extracting first and second signals from a single signal includes receiving the single signal, generating a recovered first signal by extracting and phase locking the first signal with respect to the phase of a local clock, decoding over a decode frame time the data representing an encoded phase difference at the start of the decode frame time, generating a phase difference between the first signal and the second signal as a function of data representing phase difference from a current decode frame time and data representing an encoded phase difference from an immediately prior decode frame time, subtracting the generated phase difference from the phase of the recovered first signal, and generating a recovered second signal by phase locking a signal at the second frequency at the recovered second phase.

17 Claims, 4 Drawing Sheets

EMBEDDED TIME OF DAY RECEIVER FOR CLOCK TRANSMISSION

FIELD OF THE INVENTION

The present invention relates to embedded time of day (eTod) systems. More particularly, the present invention relates to a receiver architecture for eTod clock recovery that outputs a stable clock using encoded clock information without introducing extra noise and wander.

BACKGROUND

Figure 1:
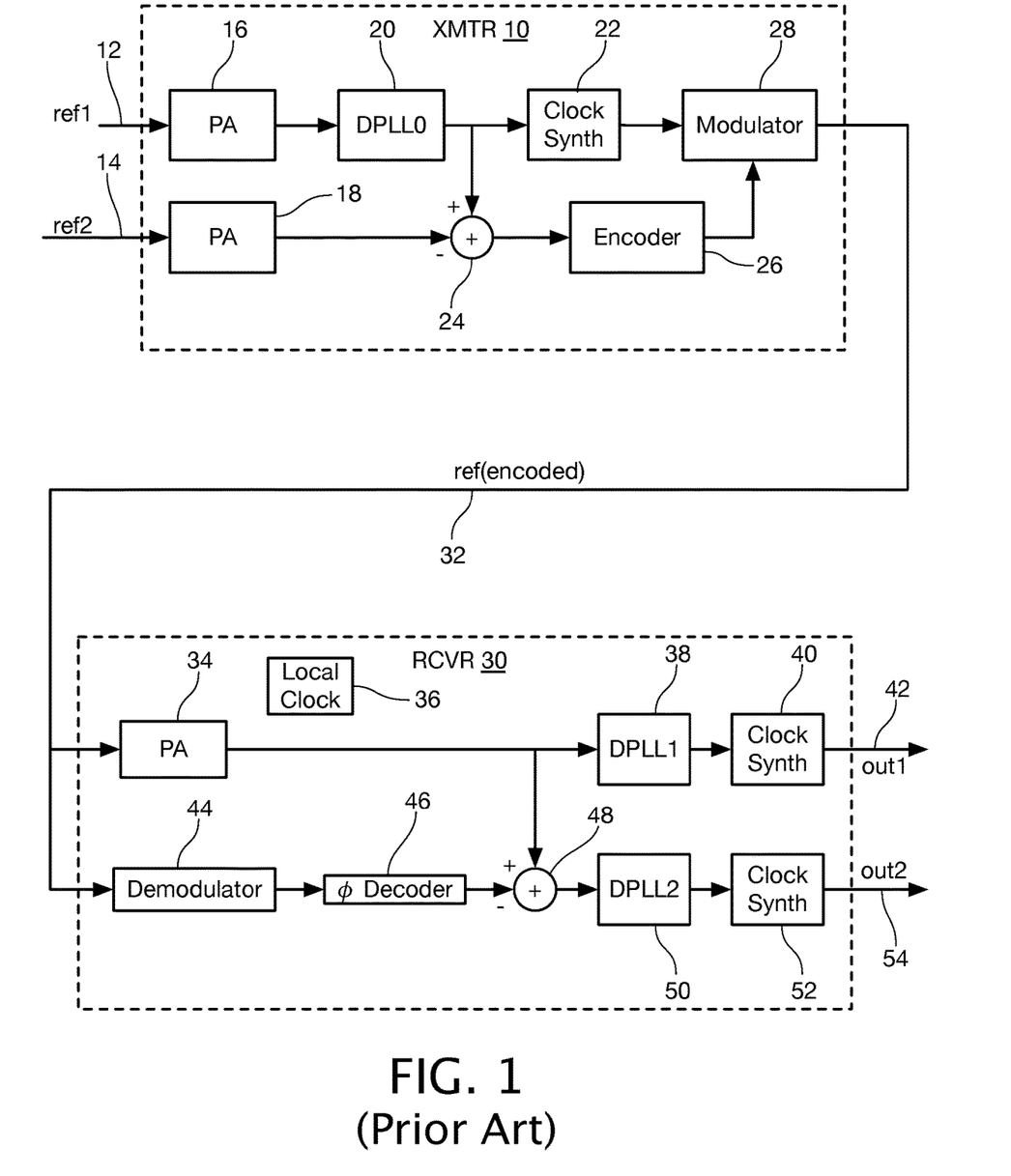
FIG. 1 is a block diagram of an embedded time of day (eTod) transmitter and receiver.

A typical system having an embedded Time of day feature (eTod) is shown in FIG. 1. A transmitter 10 has two clock reference inputs (signal ref1 at reference numeral 12 and signal ref2 at reference numeral 14).

In the following description, the clock reference signal ref1 is specified as a normal local reference clock and the clock reference signal ref2 provides updated time of day information in the form of a clock signal, for example a 1 Hz clock signal, synchronized to a time standard such as Coordinated Universal Time. The clock output at out1 at reference numeral 40 is locked to the clock reference signal ref1. The clock output at out2 at reference numeral 52 in FIG. 1 is the clock which is locked to the time of the day.

The clock reference signal ref1 presented at reference numeral 12 and the clock reference signal ref2 presented at reference numeral 14 are both 50% duty cycle square waves. The frequencies of the clock reference signals ref1 and ref2 need not be related to each other. The clock reference signal ref1 presented at the clock reference input ref1 12 is provided to phase acquisition unit (PA) 16 where its clock phase with respect to the phase of a local clock internal to the transmitter 10 is extracted. The clock reference signal ref2 presented at the clock reference input ref2 14 is provided to phase acquisition unit (PA) 18 where its clock phase with respect to the phase of the local clock internal to the transmitter 10 is extracted.

A digital phase locked loop (DPPL0) 20 is phase locked to the ref1 clock reference signal ref1. Its output is presented to clock synthesizer 22, whose output is therefore phase locked to the clock reference signal ref1. The phase difference between the output of the DPPL0 20 and the clock reference signal ref2 at the output of the phase acquisition unit 18 is determined in a subtractor circuit 24 and is encoded in encoder 26. The encoded phase difference at the output of encoder 26 is used by modulator 28 to modulate the output of the clock synthesizer 22 by changing the duty cycle of the output of the clock synthesizer 22 from the DPLL0 20 to generate a ref(encoded) signal at its output. As an example, a 25% duty cycle can be used to represent a "zero" bit and a 75% duty cycle can be used to represent a "one" digital bit. The ref(encoded) signal at the output of modulator 28 is also phase locked to the clock reference signal ref1.

A receiver 30, may be located at a random distance from the transmitter 10. On the receiver end, the receiver 30 receives the ref(encoded) reference signal from the output of the modulator 28 in the transmitter 10 on input 32. The ref(encoded) reference signal is presented to phase acquisition unit (PA) 34 where its clock phase with respect to the phase of a local clock 36 internal to the receiver 30 is extracted. A first digital phase locked loop (DPPL1) 38 is coupled to the phase acquisition unit 34. Its output is presented to clock synthesizer 40, that generates the output signal out1 at reference numeral 42 that is phase locked to the received ref(encoded) clock reference input signal.

The phase difference information between clock reference signals ref1 and ref2 that was encoded in the ref(encoded) signal is demodulated by demodulator 44 and decoded in phase decoder 46. The phase difference information is then subtracted from the phase of the ref(encoded) reference signal (which has the same phase as the ref1 reference signal) in subtractor circuit 48 to obtain a (delayed) phase of clock reference signal ref2 that is presented to a second digital phase locked loop DPLL2 50. The output of DPLL2 50 is presented to clock synthesizer 52, that generates the output signal out2 at reference numeral 54 which is locked to the clock reference signal ref2. The combination of DPLL2 50 and clock synthesizer 52 thus represents an embodiment of a circuit for generating the recovered second signal. The phase locking circuits, i.e., the first digital phase locked loop (DPPL1) 38 and the second digital phase locked loop (DPLL2) 50 are being described herein as digital phase locked loops, it being understood that this is a particular non-limiting embodiment of a phase-locked loop circuit.

In actual applications, such as in the embedded Time of day (eTod) application, where clock reference signal ref1 is the clock to be used for synchronization output (out1) 42 and clock reference signal ref2 contains the information for time of the day which is output at line out2 54, some time is required to transmit the encoded data from the transmitter 10 to the receiver 30. In the present invention, the time T that it takes to transmit all of the bits contained in a digital number that defines the phase difference between the clock reference signals ref1 and ref2 will be referred to herein as a decode frame. In the transmitter 10, the phase difference is calculated at the time when a decode frame starts at the output of the clock synthesizer 22. Depending on the number of bits needed to specify the phase difference between the clock reference signals ref1 and ref2, the digital number representing the phase difference between the clock reference signals ref1 and ref2 signals can require many clock cycles to be completely transmitted. In the receiver 30, the phase decoder 46 starts at the decode frame starting time and the phase difference can be completely demodulated at a delay time that is $T_d$ seconds later than the decode frame starting time, where $T_d$ is the time delay it takes to completely demodulate and decode the phase difference information. This time delay $T_d$ is longer if the carrier clock frequency is low and the required number of bits for encoding the phase difference between the clock reference signals ref1 and ref2 is larger to provide better resolution of the phase difference. This time delay $T_d$ will increase the lock time for the second digital phase locked loop DPLL2 50 and if it is too long may cause the second DPLL2 50 to become unstable.

The receiver 30 of FIG. 1 is used where a direct encoding method is assumed for the encoder/decoder of the phase difference between the clock reference signals ref1 and ref2. Where a direct encoding method is used, the output from the phase decoder 46 of FIG. 1 is used to obtain the clock reference signal ref2 signal phase by subtracting the output of the phase decoder 46 from the output of phase acquisition unit 34 in subtractor circuit 48.

In most cases phase decoder 46 is required because an indirect encoding method, such as delta-modulation encoding, is likely to be used for more efficient data transmission, because it requires fewer bits to be transmitted than the number of bits that are required using direct encoding. The function of demodulator 44 is to extract the bits representing the encoded phase difference and present the demodulated phase difference data to the phase decoder 46. The phase decoder 46 takes the demodulated bits from the demodulator 44 and from them generates a number that is the phase difference between the ref1 and ref2 signals. The detailed functioning of the phase decoder 46 depends on the modulation method used by the encoder 26 of FIG. 1 and persons of ordinary skill in the art will easily be able to configure the phase decoder 46 for any given modulation method.

As previously mentioned, the decoded phase adjustment represents the phase difference between the clock reference signals ref1 and ref2 at the decode frame starting time in the transmitter and there is a delay of $T_d$ seconds needed to completely decode the phase difference information at the receiver after arrival of the beginning of the decode frame. In addition, the output of the PA 34 represents reference phase value at the sample time with respect to a local clock in the receiver 30 which is not aligned with the input clock cycle (hence the decode frame boundary). All these factors will cause noise at the phase input to the second DPLL2 50 that will cause the second DPLL2 50 to take a long time to be phase locked. In some cases, the second DPLL2 50 may become unstable if the clock rate is slow and results in a long decode frame period. The worst-case time delay $T_d$ could be one decode frame cycle. This is because all data representing the phase difference between the clock reference signals ref1 and ref 2 may require an entire decode frame cycle to be transmitted.

BRIEF DESCRIPTION

According to an aspect of the invention, in a receiver receiving a single input signal that includes a first signal at a first frequency modulated by data representing an encoded phase difference between a first phase of the first signal at the first frequency and a second phase of a second signal at a second frequency, a method for extracting the first signal and the second signal from the single input signal includes receiving the single input signal, generating a recovered first input signal from the received single input signal by extracting and phase locking the first signal with respect to the phase of a local clock internal to the receiver, decoding over a decode frame time the data representing an encoded phase difference at the start of the decode frame time between the first signal and the second signal for both a current decode frame time and an immediately prior decode frame time, generating a phase difference between the first signal and the second signal as a function of decoded data representing an encoded phase difference at the start of a current decode frame time and decoded data representing an encoded phase difference at the start of an immediately prior decode frame time, subtracting the generated phase difference from the phase of the generated recovered first signal to obtain a recovered second phase of the second signal, and generating a recovered second signal by phase locking a signal at the second frequency at the recovered second phase.

According to an aspect of the invention, phase locking the first signal with respect to the phase of the local clock internal to the receiver includes phase locking the first signal with respect to the phase of the local clock internal to the receiver in a first digital phase locked loop.

According to an aspect of the invention, generating the recovered second signal by phase locking the signal at the second frequency at the recovered second phase includes phase locking the recovered second signal with respect to the phase of the local clock internal to the receiver in a second digital phase locked loop.

According to an aspect of the invention, generating the phase difference between the first signal and the second signal as the function of the decoded data representing the encoded phase difference at the start of the current decode frame time and the decoded data representing the encoded phase difference at the start of the immediately prior decode frame time includes extrapolating the decoded data representing the encoded phase difference at the start of the current decode frame time and the decoded data representing the encoded phase difference at the start of the immediately prior decode frame time.

According to an aspect of the invention, decoding over the decode frame time the data representing the encoded phase difference at the start of the decode frame time between the first signal and the second signal for both a current decode frame time and the immediately prior decode frame time includes delaying the decoded data for a delay time of one decode frame time.

According to an aspect of the invention, generating the phase difference between the first signal and the second signal as the function of the decoded data representing the encoded phase difference at the start of the current decode frame time and the decoded data representing the encoded phase difference at the start of the immediately prior decode frame time includes delaying the first signal by a decode frame time, subtracting the generated phase difference from the phase of the delayed first signal, and interpolating the decoded data representing an encoded phase difference at the start of the current decode frame time and the decoded data representing the encoded phase difference at the start of the immediately prior decode frame time.

According to an aspect of the invention, generating the phase difference between the first signal and the second signal as the function of the decoded data representing the encoded phase difference at the start of the current decode frame time and the decoded data representing the encoded phase difference at the start of the immediately prior decode frame time includes low-pass filtering the subtracted generated phase difference from the phase of the first signal to obtain the phase of the second signal, and linearly extrapolating the decoded data representing the encoded phase difference at the start of the current decode frame time and the decoded data representing the encoded phase difference at the start of the immediately prior decode frame time.

According to an aspect of the invention, low-pass filtering the subtracted generated phase difference from the phase of the first signal to obtain the phase of the second signal includes low-pass filtering the subtracted generated phase difference from the phase of the first signal using a multiplier-based low-pass filter.

According to an aspect of the invention, low-pass filtering the subtracted generated phase difference from the phase of the first signal to obtain the phase of the second signal includes low-pass filtering the subtracted generated phase difference from the phase of the first signal using an adder and shifter based low-pass filter.

According to an aspect of the invention, a receiver for extracting a first signal and a second signal from a single input signal includes a phase acquisition unit and a first phase locked loop circuit coupled to an input of the receiver for extracting and phase locking from the single signal the first signal with respect to the phase of a local clock internal to the receiver, a phase decoder for decoding over a decode frame time the data representing an encoded phase difference at the start of the decode frame time between the first signal and the second signal for both a current decode frame time and an immediately prior decode frame time for both a current decode frame time and an immediately prior decode frame time, a circuit coupled to the phase acquisition unit and the phase decoder for generating a phase difference between the first signal and the second signal as a function of decoded data representing an encoded phase difference at the start of a current decode frame time and decoded data representing an encoded phase difference at the start of an immediately prior decode frame time, a subtractor circuit, coupled to the phase acquisition unit and the circuit for generating the phase difference, for subtracting the generated phase difference from the phase of the recovered first signal to obtain a recovered second phase of the second signal, and a second phase locked loop circuit for generating a recovered second signal by phase locking a signal at the second frequency at the recovered second phase.

According to an aspect of the invention, the first phase locked loop circuit includes a digital phase locked loop locked to the first signal.

According to an aspect of the invention, the second phase locked loop circuit for generating the recovered second signal by phase locking the signal at the second frequency at the recovered second phase is a digital phase locked loop locked to the second signal.

According to an aspect of the invention, the decoder includes a delay circuit having a delay time of one decode frame time.

According to an aspect of the invention, wherein the circuit coupled to the phase acquisition unit and the decoder for generating the phase difference between the first signal and the second signal as the function of decoded data representing the encoded phase difference at the start of a current decode frame time and decoded data representing the encoded phase difference at the start of the immediately prior decode frame time includes an extrapolator circuit.

According to an aspect of the invention, the first phase locked loop circuit includes a digital phase locked loop locked to the first signal through a first signal delay circuit, the circuit coupled to the phase acquisition unit and the decoder for generating the phase difference between the first signal and the second signal as the function of decoded data representing the encoded phase difference at the start of the current decode frame time and decoded data representing the encoded phase difference at the start of the immediately prior decode frame time includes an interpolator circuit, and the subtractor circuit is coupled to the phase acquisition unit through the first signal delay circuit.

According to an aspect of the invention, the circuit coupled to the phase acquisition unit and the decoder for generating the phase difference between the first signal and the second signal as the function of decoded data representing the encoded phase difference at the start of the current decode frame time and decoded data representing the encoded phase difference at the start of an immediately prior decode frame time includes a linear extrapolator circuit.

According to an aspect of the invention, the linear extrapolator circuit is directly coupled to the decoder, and the linear extrapolator circuit is further coupled to the decoder through: a delay circuit having an output, a subtractor circuit subtracting the output of the delay circuit from the output of the decoder circuit, and a low pass filter coupled between the subtractor circuit and the linear extrapolator.

BRIEF DESCRIPTION OF THE DRAWING FIGURES

The invention will be explained in more detail in the following with reference to embodiments and to the drawing in which are shown.

DETAILED DESCRIPTION

Persons of ordinary skill in the art will realize that the following description is illustrative only and not in any way limiting. Other embodiments will readily suggest themselves to such skilled persons.

Such skilled persons will also appreciate that the present invention may be implemented for any eTod-like encode, decode, and modulating scheme using, for example, direct modulation or delta modulation.

In accordance with aspects of the present invention, the relative phase between a first clock reference signal ref1 and a second clock reference signal ref2 presented to the input of a transmitter is replicated at the output of a receiver coupled to the transmitter. Several techniques are presented for addressing the delay problem presented in the prior art without causing extra wander and noise for the second DPLL2 output.

Figure 2:
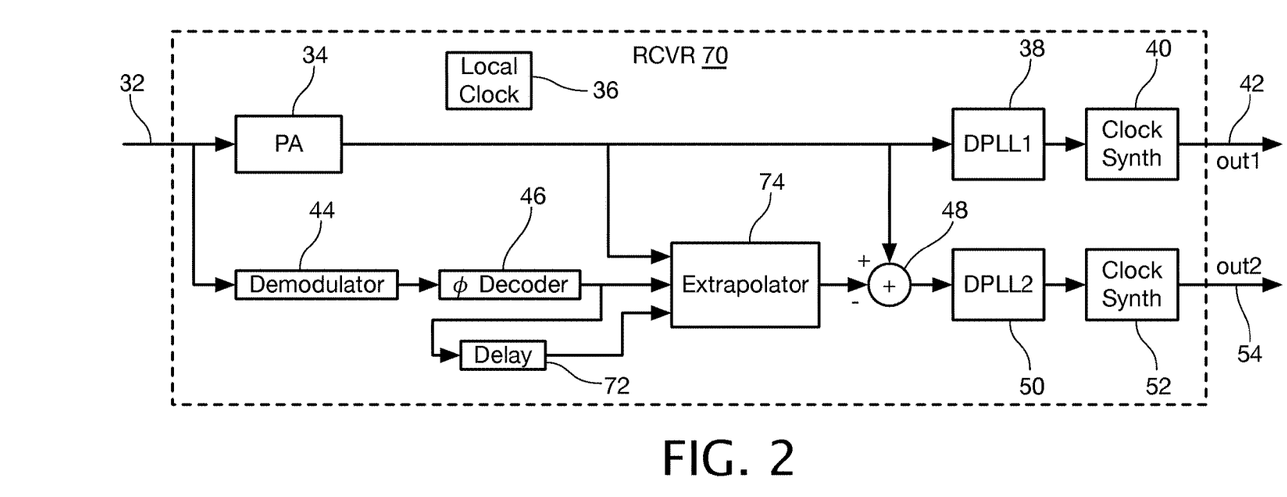
FIG. 2 is a block diagram showing a portion of an eTod receiver in accordance with an aspect of the present invention using extrapolation for phase adjustment.

Referring now to FIG. 2, a block diagram of a receiver 70 for performing an extrapolation method for phase adjustment in the receiver is shown. The components of the receiver 70 of FIG. 2 that are the same as the components of the receiver 30 of FIG. 1 will be identified using the same reference numerals that are used to identify these components in FIG. 1. The receiver 70 receives the ref(encoded) signal on line 32 and presents it to both the PA 34 and the demodulator 44. The demodulated value at the output of the demodulator 44 drives the phase decoder 46. The output of the phase decoder 46 is the phase adjustment value for the current decode frame starting time.

FIG. 2 shows a first approach for the alignment of phase adjustment and PA reference clock phase. As in the receiver section depicted in FIG. 1, the phase decoder 46 will decode the phase adjustment value for the current decode frame starting time. At time $t_0$, the phase decoder 46 provides the decoded phase adjustment value ($P_0$) for the current decode frame that was sent by the transmitter 10. The delay 72 introduces one decode frame delay period and provides the decoded phase adjustment value ($P_{-1}$) for the previous decode frame. PA 34 provides the reference phase information for the signal ref1 at the sample time of the receiver local clock which is time $t_0$. The decode frame starting time $t_0 - T_d$ as well as the identifier of time $t_0$ is known to and provided by the receiver 70.

At time $t_0$, the phase decoder 46 provides decoded phase adjustment value ($P_0$) at decode frame starting time $t_0 - T_d$.

The delay 72 provides the phase adjustment value ($P_{-1}$) which is the phase adjustment value that was decoded at the previous decode frame starting time $t_0-T_d-T$, where T is the decode frame period.

The extrapolation is performed in extrapolator 74. Extrapolator 74 has an input taken from PA 34 which provides the time information $t_0$ and $t_0-T_d$ from which $T_d$ is extracted. The extrapolator 74 also has inputs taken from phase decoder 46 ($P_0$) and delay 72 ($P_{-1}$). The extrapolator 74 provides the adjustment phase $P_\alpha$ at time $t_0$ as:

$$P_\alpha = P_0 + \frac{P_0 - P_{-1}}{T} T_d$$

Thus, extrapolator 74 is an embodiment of a circuit for generating a phase difference between the first signal and the second signal as a function of decoded data representing an encoded phase difference at the start of a current decode frame time and decoded data representing an encoded phase difference at the start of an immediately prior decode frame time. The adjusted phase $P_\alpha$ is subtracted from the reference phase provided by PA 34 in subtractor circuit 48 to provide an equivalent phase for clock reference signal ref2 to which the second DPLL2 50 will lock.

If the clock reference signals ref2 and ref1 have a constant phase offset, $P_0-P_{-1}$ will be constant and this method provides a simple way for correct phase adjustment at time $t_0$. However, if either clock reference signal ref1 or clock reference signal ref2 has noise or wander in it, the noise or wander will be increased due to the extrapolation.

From the sampling theorem, it is known that since phase adjustment is done every T (seconds) and the maximum DPLL sampling rate is 1/T, the maximum noise bandwidth or the highest wander frequency has to be smaller than the Nyquist rate 1/(2T) in order to ensure that the output clock is locked to the reference clock.

For the worst case, when $T_d$ is close to T and the frequency of noise or wander is close to 1/(2T), the magnitude of the noise or wander for the output clock is twice the magnitude of the noise or wander for the reference clock.

Figure 3:
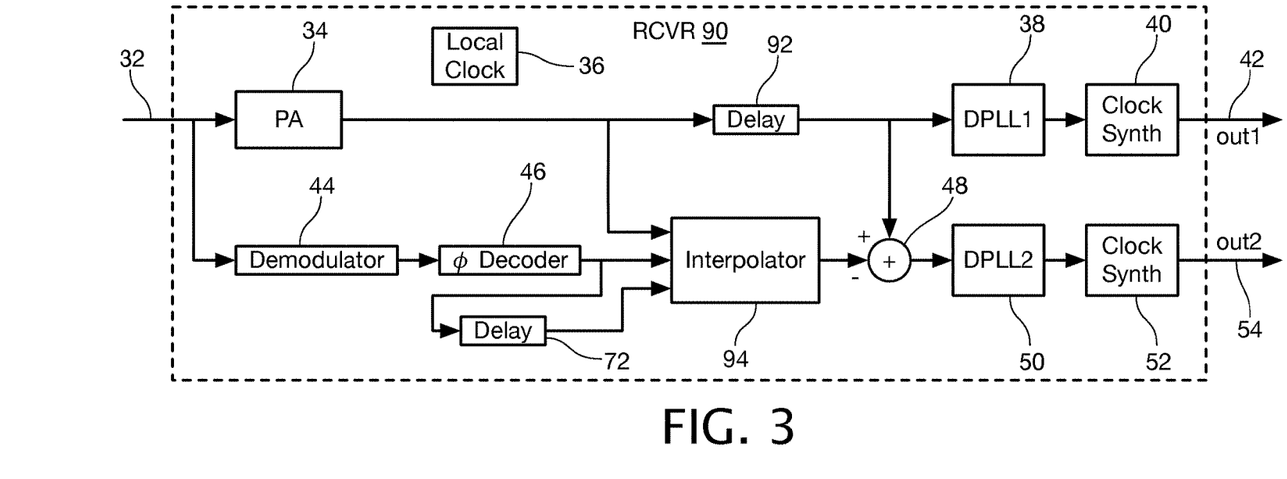
FIG. 3 is a block diagram showing a portion of an eTod receiver in accordance with an aspect of the present invention using interpolation for phase adjustment.

Referring now to FIG. 3, a receiver 90 is shown that performs an interpolation method for phase adjustment.

The circuit of FIG. 3 has some function blocks that are the same as those of the circuit of FIG. 2 that are identified using the same reference numerals used in FIG. 2. In the circuit 90 of FIG. 3, the reference clock phase derived from the ref(encoded) signal at the receiver input 32 is delayed in delay 92 by one decode frame cycle before being sent to the first DPLL1 38 so that the interpolation method can be used.

At time $t_0$, the input to the second DPLL2 50 is the difference between the reference phase output of PA 34 at time $t_0-T$ and the modified phase adjustment value provided by the interpolator 94. The phase decoder 46 provides the decoded phase adjustment value ($P_0$) at decode frame starting time $t_0-T_d$. The delay 72 provides the phase adjustment value ($P_{-1}$) at the previous decode frame starting time $t_0-T_d-T$. Since $T>T_d$, the adjustment phase $P_\alpha$ at time $t_0-T$ needs to be obtained, which is between $P_0$ and $P_{-1}$. Using linear interpolation performed in interpolator 94:

$$P_\alpha = P_{-1} + \frac{P_0 - P_{-1}}{T} T_d$$

Thus, interpolator 94 is an embodiment of a circuit for generating a phase difference between the first signal and the second signal as a function of decoded data representing an encoded phase difference at the start of a current decode frame time and decoded data representing an encoded phase difference at the start of an immediately prior decode frame time. The subtractor circuit 48 provides phase of the clock reference signal ref2 by subtracting the interpolated phase difference from interpolator 94 from the signal output of PA 34 delayed by delay circuit 92.

The approach shown in FIG. 3 will provide accurate phase adjustment value at the right time without increasing wander and noise in the reference clocks. One drawback of the approach of FIG. 3 is that the extra delay from delay circuit 92 in the reference path may cause clock misalignment. In many applications, it is required that the delay in the transmitter and receiver path be minimized. Also, the delay may impact DPLL loop behavior in the system.

Figure 4:
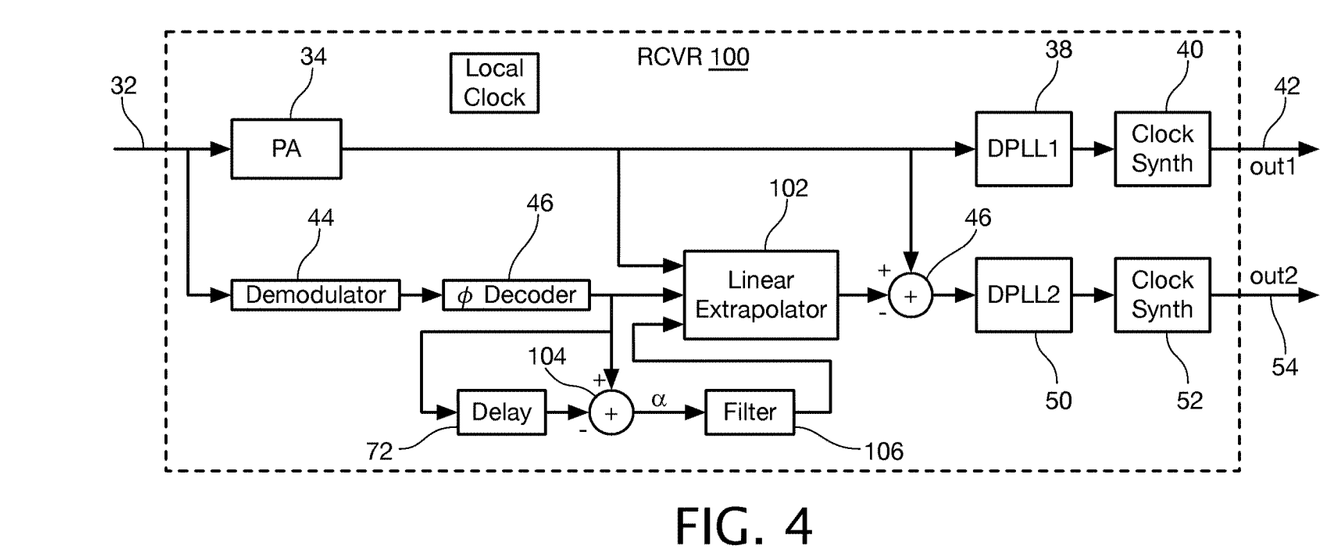
FIG. 4 is a block diagram showing a portion of an eTod receiver in accordance with an aspect of the present invention using extrapolation with filtering for phase adjustment.

Referring now to FIG. 4, receiver 100 is shown that includes circuitry for performing an extrapolation method with filtering for phase adjustment. The approach of FIG. 4 is linear extrapolation combined with low-pass filtering.

In the circuit 100 of FIG. 4, the linear extrapolator 102 takes the current decoded phase adjustment value from phase decoder 46 as the initial value ($P_0$) and a filtered phase adjustment difference ($\alpha$) obtained as the difference between the output of the phase decoder 46 and the delay 72 from subtractor 104 between two adjacent decode frames as a slope value, after being filtered by low pass filter 106. The decoded phase adjustment value output by phase decoder 46 is the phase difference between the clock reference signals ref1 and ref2, which includes the offset between the two clock reference signals ref1 and ref2 and noise (or wander), since the clock reference signals ref1 and ref2 have a constant frequency offset. The difference between two adjacent phase adjustment values corresponds to the phase difference between the two clock reference signals ref1 and ref2 in one decode frame cycle, which because of the constant frequency offset is a constant value in the absence of noise. The low pass filter 104 cleans the noise and outputs the filtered phase adjustment difference ($\alpha$) in one decode frame cycle.

At time $t_0$, with current decoded phase adjustment value ($P_0$) representing the phase adjustment at time ($t_0-T_d$) and the delayed phase adjustment value ($P_{-1}$) representing the phase adjustment at time ($t_0-T_d-T$), the linearly extrapolated phase adjustment at time $t_0$ is calculated by linear extrapolator 102 as:

$$P_\alpha = P_0 + \alpha \times T_d$$

where $\alpha$ is the filtered offset $P_0-P_{-1}$. Thus, linear extrapolator 102 is an embodiment of a circuit for generating a phase difference between the first signal and the second signal as a function of decoded data representing an encoded phase difference at the start of a current decode frame time and decoded data representing an encoded phase difference at the start of an immediately prior decode frame time. With the approach shown in FIG. 4, only the stable frequency offset between the clock reference signals ref1 and ref2 provided by the low pass filter 106 is used for extrapolation to obtain the correct phase adjustment at time $t_0$. From the above equation it can be observed that the noise (or wander) at $P\alpha$ will be the same as the noise (or wander) at $P_0$ received (decoded) at time $t_0-T_d$ (the decode frame starting time) since the noise on $\alpha$ has been filtered.

Figure 5:
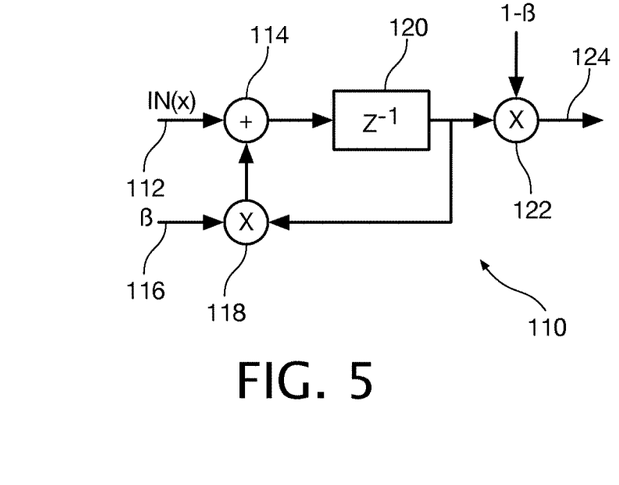
FIG. 5 is a block diagram showing a simple filter implementation that may be employed in an eTod receiver in accordance with the present invention.

Referring now to FIG. 5, a diagram shows a low-pass filter circuit 110 implemented with filter coefficient $\beta$ which is suitable for use as low-pass filter 106. The input IN(x) 112 is added in adder 114 with the constant β provided at input 116 and multiplied in multiplier 118 by the output of $Z^{-1}$ digital filter delay circuit 120, where $Z^{-1}$ is the unit delay for the digital filter with a delay time the same as the sample period. The output of $Z^{-1}$ circuit 120 is multiplied by the constant 1−β in multiplier 122 to produce the low-pass filtered output at reference numeral 124 to be provided to linear extrapolation circuit 102.

The filter response between the filter input(x) and output (y) is:

$$\frac{1-\beta}{1-\beta Z^{-1}}$$

The low-pass filter circuit 110 filters out the high frequency wander and noise. For the low frequency wander and noise, the extrapolation would not create too much error. One suitable choice for the filter coefficient β is =1/64.

Figure 6:
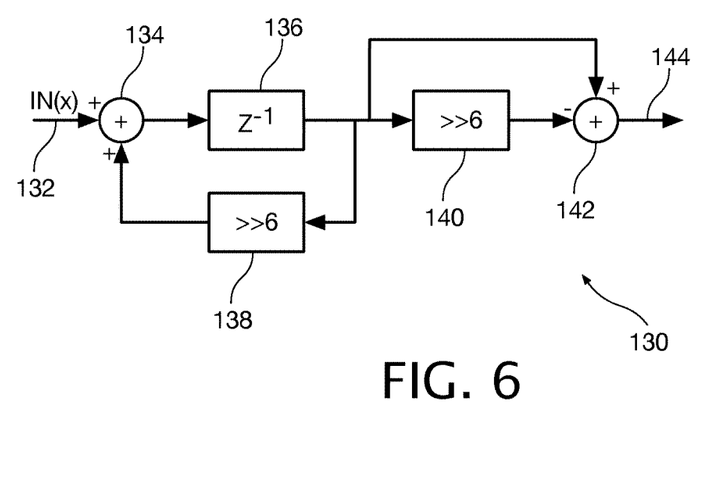
FIG. 6 is a block diagram showing a multiplierless filter implementation that may be employed in an eTod receiver in accordance with the present invention.

Referring now to FIG. 6, a multiplierless filter circuit 130 is shown which is suitable for use as low-pass filter 106. The filter circuit 130 of FIG. 6 is implemented using addition and shift operations in place of multiplication. Thus, shift right 6 bits shifter 138 is used in the filter 130 of FIG. 6 in place of multiplier 118 in the filter 110 of FIG. 6. Shift right 6 bits shifter 140 in combination with adder 142 is used in the filter 130 of FIG. 6 in place of multiplier 122 in the filter 110 of FIG. 5.

Figure 7:
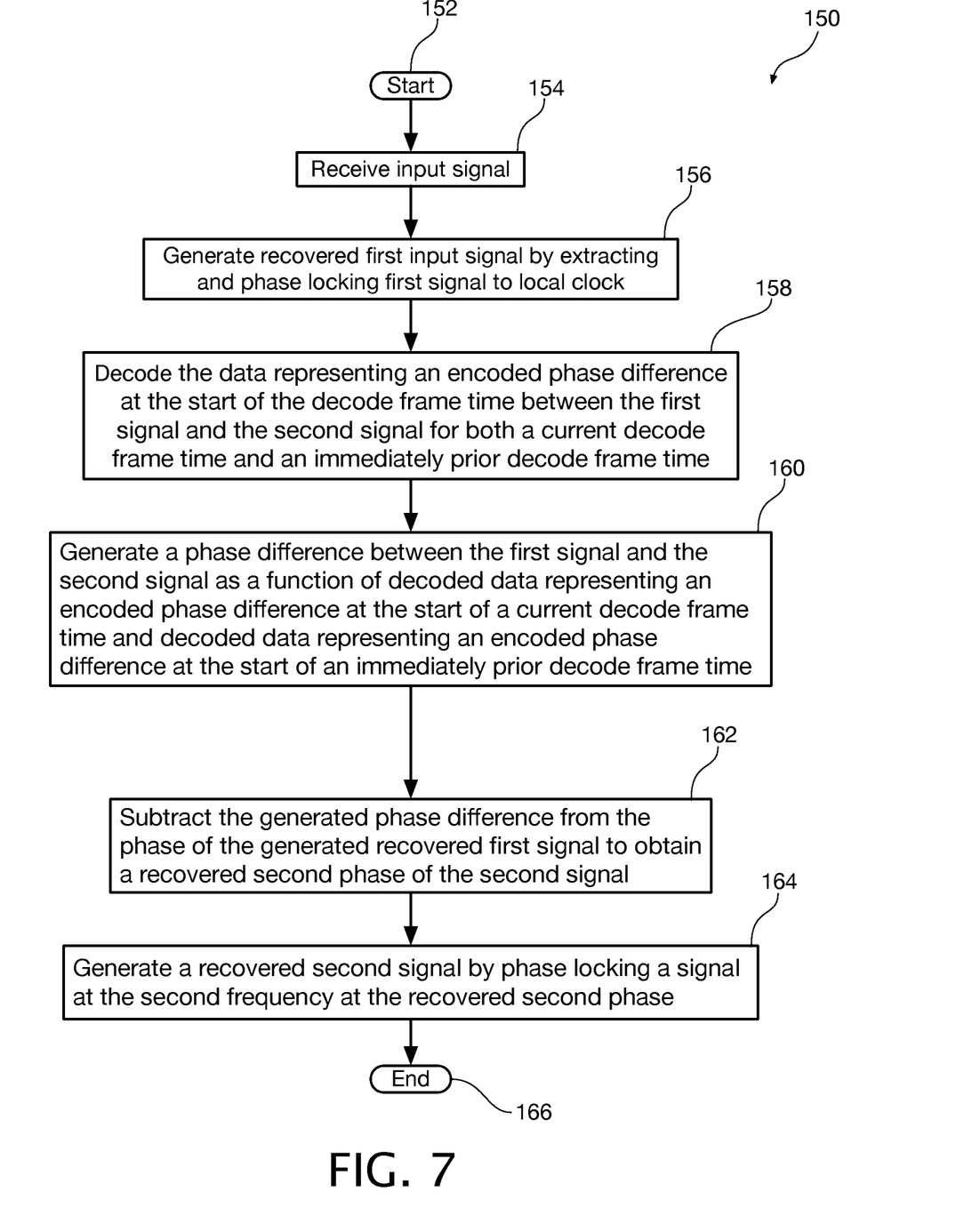
FIG. 7 is a flow diagram illustrating a method for extracting the first signal and the second signal from the single input signal in accordance with an aspect of the invention.

Referring now to FIG. 7, a flow diagram shows an illustrative method 150 for extracting the first signal and the second signal from the single input signal in accordance with an aspect of the invention. The method begins at reference numeral 152.

At reference numeral 154, the input signal is received. At reference numeral 156, the recovered first input signal is generated by extracting and phase locking the first signal to the local clock.

At reference numeral 158, the data representing an encoded phase difference at the start of the decode frame time between the first signal and the second signal is decoded for both a current decode frame time and an immediately prior decode frame time.

At reference numeral 160, a phase difference between the first signal and the second signal is generated as a function of decoded data representing an encoded phase difference at the start of a current decode frame time and decoded data representing an encoded phase difference at the start of an immediately prior decode frame time.

At reference numeral 162, the generated phase difference is subtracted from the phase of the generated recovered first signal to obtain a recovered second phase of the second signal.

At reference numeral 164, a recovered second signal is generated by phase locking a signal at the second frequency at the recovered second phase. The method ends at reference numeral 166.

The present invention provides a system having a receiver for transmission of two clock signals using a single transmission line. The present invention is well suited for embedded time-of-day (eTod) receiver design. Extrapolation or interpolation are used to provide decoded phase adjustment to improve DPLL loop stability. The use of extrapolation in combination with a low-pass filter can improve DPLL loop stability without increasing output clock wander and noise.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In a receiver receiving a single input signal that includes a first signal at a first frequency modulated by data representing an encoded phase difference between a first phase of the first signal at the first frequency and a second phase of a second signal at a second frequency, a method for extracting the first signal and the second signal from the single input signal, the method comprising:

receiving the single input signal;

generating a recovered first input signal from the received single input signal by extracting and phase locking the first signal with respect to the phase of a local clock internal to the receiver;

decoding over a decode frame time the data representing an encoded phase difference at the start of the decode frame time between the first signal and the second signal for both a current decode frame time and an immediately prior decode frame time;

generating a phase difference between the first signal and the second signal as a function of decoded data representing an encoded phase difference at the start of a current decode frame time and decoded data representing an encoded phase difference at the start of an immediately prior decode frame time;

subtracting the generated phase difference from the phase of the generated recovered first signal to obtain a recovered second phase of the second signal; and generating a recovered second signal by phase locking a signal at the second frequency at the recovered second phase.

2. The method of claim 1 wherein phase locking the first signal with respect to the phase of the local clock internal to the receiver comprises phase locking the first signal with respect to the phase of the local clock internal to the receiver in a first digital phase locked loop.

3. The method of claim 1 wherein generating the recovered second signal by phase locking the signal at the second frequency at the recovered second phase comprises:

phase locking the recovered second signal with respect to the phase of the local clock internal to the receiver in a second digital phase locked loop.

4. The method of claim 1 wherein generating the phase difference between the first signal and the second signal as the function of the decoded data representing the encoded phase difference at the start of the current decode frame time and the decoded data representing the encoded phase difference at the start of the immediately prior decode frame time comprises:

extrapolating the decoded data representing the encoded phase difference at the start of the current decode frame time and the decoded data representing the encoded phase difference at the start of the immediately prior decode frame time.

5. The method of claim 1 wherein decoding over the decode frame time the data representing the encoded phase difference at the start of the decode frame time between the first signal and the second signal for both a current decode frame time and the immediately prior decode frame time comprises:

delaying the decoded data for a delay time of one decode frame time.

6. The method of claim 1 wherein generating the phase difference between the first signal and the second signal as the function of the decoded data representing the encoded phase difference at the start of the current decode frame time and the decoded data representing the encoded phase difference at the start of the immediately prior decode frame time comprises:
   delaying the first signal by a decode frame time;
   subtracting the generated phase difference from the phase of the delayed first signal; and
   interpolating the decoded data representing an encoded phase difference at the start of the current decode frame time and the decoded data representing the encoded phase difference at the start of the immediately prior decode frame time.

7. The method of claim 1 wherein generating the phase difference between the first signal and the second signal as the function of the decoded data representing the encoded phase difference at the start of the current decode frame time and the decoded data representing the encoded phase difference at the start of the immediately prior decode frame time comprises:
   low-pass filtering the subtracted generated phase difference from the phase of the first signal to obtain the phase of the second signal; and
   linearly extrapolating the decoded data representing the encoded phase difference at the start of the current decode frame time and the decoded data representing the encoded phase difference at the start of the immediately prior decode frame time.

8. The method of claim 7 wherein low-pass filtering the subtracted generated phase difference from the phase of the first signal to obtain the phase of the second signal comprises:
   low-pass filtering the subtracted generated phase difference from the phase of the first signal using a multiplier-based low-pass filter.

9. The method of claim 7 wherein low-pass filtering the subtracted generated phase difference from the phase of the first signal to obtain the phase of the second signal comprises:
   low-pass filtering the subtracted generated phase difference from the phase of the first signal using an adder and shifter based low-pass filter.

10. A receiver for extracting a first signal and a second signal from a single input signal, comprising:
   a phase acquisition unit and a first phase locked loop circuit coupled to an input of the receiver for extracting and phase locking from the single signal the first signal with respect to the phase of a local clock internal to the receiver;
   a phase decoder for decoding over a decode frame time the data representing an encoded phase difference at the start of the decode frame time between the first signal and the second signal for both a current decode frame time and an immediately prior decode frame time;
   a circuit coupled to the phase acquisition unit and the phase decoder for generating a phase difference between the first signal and the second signal as a function of decoded data representing an encoded phase difference at the start of a current decode frame time and decoded data representing an encoded phase difference at the start of an immediately prior decode frame time;
   a subtractor circuit, coupled to the phase acquisition unit and the circuit for generating the phase difference, for subtracting the generated phase difference from the phase of the recovered first signal to obtain a recovered second phase of the second signal; and
   a second phase locked loop circuit for generating a recovered second signal by phase locking a signal at the second frequency at the recovered second phase.

11. The receiver of claim 10 wherein the first phase locked loop circuit comprises a digital phase locked loop locked to the first signal.

12. The receiver of claim 10 wherein the second phase locked loop circuit for generating the recovered second signal by phase locking the signal at the second frequency at the recovered second phase is a digital phase locked loop locked to the second signal.

13. The receiver of claim 10 wherein the decoder comprises a delay circuit having a delay time of one decode frame time.

14. The receiver of claim 10 wherein the circuit coupled to the phase acquisition unit and the decoder for generating the phase difference between the first signal and the second signal as the function of decoded data representing the encoded phase difference at the start of a current decode frame time and decoded data representing the encoded phase difference at the start of the immediately prior decode frame time comprises an extrapolator circuit.

15. The receiver of claim 10 wherein;
   the first phase locked loop circuit comprises a digital phase locked loop locked to the first signal through a first signal delay circuit;
   the circuit coupled to the phase acquisition unit and the decoder for generating the phase difference between the first signal and the second signal as the function of decoded data representing the encoded phase difference at the start of the current decode frame time and decoded data representing the encoded phase difference at the start of the immediately prior decode frame time comprises an interpolator circuit; and
   the subtractor circuit is coupled to the phase acquisition unit through the first signal delay circuit.

16. The receiver of claim 10 wherein the circuit coupled to the phase acquisition unit and the decoder for generating the phase difference between the first signal and the second signal as the function of decoded data representing the encoded phase difference at the start of the current decode frame time and decoded data representing the encoded phase difference at the start of an immediately prior decode frame time comprises a linear extrapolator circuit.

17. The receiver of claim 16 wherein:
   the linear extrapolator circuit is directly coupled to the decoder; and
   the linear extrapolator circuit is further coupled to the decoder through:
      a delay circuit having an output;
      a subtractor circuit subtracting the output of the delay circuit from the output of the decoder circuit; and
      a low pass filter coupled between the subtractor circuit and the linear extrapolator.

* * * * *

UNITED STATES PATENT AND TRADEMARK OFFICE
CERTIFICATE OF CORRECTION

PATENT NO. : 10,715,307 B1
APPLICATION NO. : 16/563399
DATED : July 14, 2020
INVENTOR(S) : Qu Gary Jin Page 1 of 1

It is certified that error appears in the above-identified patent and that said Letters Patent is hereby corrected as shown below:

In the Claims

Claim 10, Lines 11-12, delete the phrase "for both a current decode frame time and an immediately prior decode frame time".

Claim 13, Line 1, add the word --phase-- before the word "decoder".

Claim 14, Line 2, add the word --phase-- before the word "decoder".

Claim 17, Line 3, add the word --phase-- before the word "decoder".

Claim 17, Line 5, add the word --phase-- before the word "decoder".

Signed and Sealed this
Twelfth Day of January, 2021

Andrei Iancu
*Director of the United States Patent and Trademark Office*